(12) United States Patent
Frauwallner et al.

(10) Patent No.: US 11,051,406 B2
(45) Date of Patent: Jun. 29, 2021

(54) COMPONENT CARRIER WITH INTEGRATED INDUCTOR AND MANUFACTURING METHOD

(71) Applicant: AT&S Austria Technologie & Systemtechnik Aktiengesellschaft, Leoben (AT)

(72) Inventors: Rainer Frauwallner, Tragöß (AT); Marco Gavagnin, Leoben (AT); Christian Vockenberger, Leoben (AT)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 0 days.

(21) Appl. No.: 16/446,434

(22) Filed: Jun. 19, 2019

(65) Prior Publication Data
US 2019/0394878 A1 Dec. 26, 2019

(30) Foreign Application Priority Data
Jun. 20, 2018 (EP) ..................................... 18178702

(51) Int. Cl.
*H05K 1/16* (2006.01)
*H01F 27/28* (2006.01)
(Continued)

(52) U.S. Cl.
CPC ......... *H05K 1/165* (2013.01); *H01F 27/2804* (2013.01); *H01F 41/041* (2013.01);
(Continued)

(58) Field of Classification Search
CPC .. H05K 1/165; H05K 3/0011; H01F 27/2804; H01F 41/041; H01F 2027/2809; H02M 3/155
(Continued)

(56) References Cited

U.S. PATENT DOCUMENTS

| 5,469,334 A | 11/1995 | Balakrishnan |
| 5,884,990 A | 3/1999 | Burghartz et al. |

(Continued)

FOREIGN PATENT DOCUMENTS

| CN | 105304296 A | 2/2016 |
| CN | 207022275 U | 2/2018 |
| GB | 2 535 762 A | 8/2016 |

OTHER PUBLICATIONS

Tanimoto, Japanese Patent Publication No. 3818478 (Sep. 6, 2006) (Year: 2006).*

*Primary Examiner* — Tremesha S Willis
(74) *Attorney, Agent, or Firm* — Robert A. Blaha; Smith Tempel Blaha LLC

(57) ABSTRACT

Provided is a method of manufacturing a component carrier that includes forming a magnetic core on a base structure; forming a through hole in at least one dielectric layer; forming a plurality of electrically conductive windings on the at least one dielectric layer around the through hole; forming a stack with the base structure having the magnetic core, the at least one dielectric layer and another base structure such that the magnetic core is inserted into the through hole and the conductive windings are arranged around the magnetic core such that the magnetic core and the plurality of electrically conductive windings are interposed between the base structure and the other base structure.

20 Claims, 8 Drawing Sheets

(51) Int. Cl.
   *H01F 41/04* (2006.01)
   *H02M 3/155* (2006.01)
   *H05K 3/00* (2006.01)

(52) U.S. Cl.
   CPC .......... *H02M 3/155* (2013.01); *H05K 3/0011* (2013.01); *H01F 2027/2809* (2013.01); *H05K 2201/086* (2013.01)

(58) Field of Classification Search
   USPC ........................................................ 174/260
   See application file for complete search history.

(56) References Cited

U.S. PATENT DOCUMENTS

| | | |
|---|---|---|
| 7,256,676 B2 | 8/2007 | Poynton |
| 7,307,341 B2 | 12/2007 | Humbert et al. |
| 8,094,458 B2 | 1/2012 | Furnival |
| 2007/0030659 A1 | 2/2007 | Suzuki et al. |
| 2007/0290783 A1 | 12/2007 | Whittaker et al. |
| 2008/0084167 A1 | 4/2008 | Waffenschmidt et al. |
| 2009/0237899 A1 | 9/2009 | Furnival |
| 2014/0117495 A1 | 5/2014 | Li et al. |
| 2015/0062989 A1 | 3/2015 | Su et al. |
| 2015/0101854 A1 | 4/2015 | Lee et al. |
| 2016/0049235 A1 | 2/2016 | Parish et al. |
| 2018/0076704 A1 | 3/2018 | Kneller et al. |

\* cited by examiner

COMPONENT CARRIER WITH INTEGRATED INDUCTOR AND MANUFACTURING METHOD

CROSS-REFERENCE TO RELATED APPLICATIONS

This application claims the benefit of the filing date of the European Patent Application No. 18 178 702.9 filed 20 Jun. 2018, the disclosure of which is hereby incorporated herein by reference.

TECHNICAL FIELD

The present invention relates to a method of manufacturing a component carrier and relates to a component carrier, in particular comprising at least one inductor or at least one integrated transformer, wherein the component carrier may be in particular configured as a DC/DC converter.

TECHNOLOGICAL BACKGROUND

US 2009/237899 A1 discloses a printed circuit board (PCB) substrate which can be used in a semiconductor package. A magnetic component includes a laterally extending bottom plate, two or more vertically extending posts, and a laterally extending top plate, wherein the bottom plate is fully embedded within the PCB substrate and the two or more posts extend in the PCB substrate from the bottom plate towards the upper surface of the PCB substrate. The top plate contacts an end of each of the two or more posts along the top surface of the PCB substrate. During the lamination process, prepreg flows and fills the space between cores and the walls of PCB holes or grooves. Primary winding layers and secondary winding layers are formed in upper PCB layers. In another embodiment, primary windings and secondary windings are formed in upper PCB layers and are separated from each other by prepreg. Posts of an E-core extend through holes made in upper PCB layers and contact I-bar along the top surface of the PCB.

US 2015/062989 discloses a power converter with embedded inductor substrate, wherein an inductor as a body of magnetic material is embedded in a substrate formed by a plurality of printed circuit board lamina, wherein inductor windings are formed of PCB cladding and vias which may be of any desired number of turns and may include inversely coupled windings and which provide a lateral flux paths. A four-layer architecture is provided comprising two layers of PCB lamina including the embedded body of magnetic material, a sealed layer and an additional layer of PCB lamina, including cladding for supporting and connecting a switching circuit, a capacitor and the inductor. Magnetic material may be embedded in a two-layer PCB laminated structure. Windings are configured for a lateral flux planar inductor.

US 2016/0049235 A1 discloses an embedded magnetic component device which includes a magnetic core located in a cavity extending into an insulating substrate. Through holes extend through the cover layer and the insulating substrate and are plated to define conductive vias. Metallic traces are provided at exterior surfaces of the cover layer and the insulating substrate to define upper and lower winding layers. The metallic traces and conductive vias define the respective primary and secondary side windings for an embedded transformer.

CN 105304296 discloses a planar transformer of a printed circuit board, wherein a planar multi-layer stacked structure is adopted by a primary winding and a secondary winding and the coupling between the winding is relatively compact. The planar transformer is integrated into a whole body of a multi-layer printed board.

The conventional systems of forming an inductor and in particular a transformer, do not always provide a high reliability, less mechanical stress, high thermal management capability and simple manufacturing.

SUMMARY

Thus, there may be a need for a method of manufacturing a component carrier and there may be a need for a component carrier which provides on one hand at least one inductor and has a high reliability, less mechanical stress, improved electrical performance, high thermal management capability and in particular reduced copper paths translating in reduced losses. Further, there may be a need for a DC/DC converter which provides high reliability and improved performance and small size and weight.

This need may be met by the subject matter according to the independent claims. Advantageous embodiments of the present invention are described by the dependent claims. One embodiment also provides a DC/DC converter as a particular configuration of the inventive component carrier.

According to an embodiment of the present invention it is provided a method of manufacturing a component carrier, wherein the method comprises forming a magnetic core on a base structure; forming a through hole in at least one dielectric layer; forming a plurality of electrically conductive windings on the at least one dielectric layer around the through hole; forming a stack comprising the base structure having the magnetic core, the at least one dielectric layer and another base structure such that the magnetic core is inserted into the through hole and the conductive windings are arranged around the magnetic core and such that the magnetic core and the plurality of electrically conductive windings are interposed between the base structure and the other base structure.

According to a further aspect of the invention there is described a component carrier comprising a stack including a base structure having a magnetic core thereon; at least one dielectric layer having a through hole and a plurality of electrically conductive windings thereon around the through hole; and another base structure. The base structure with the magnetic core, the at least one dielectric layer and the other base structure being stacked such that the magnetic core is inserted into the through hole and the windings are arranged around the magnetic core such that the magnetic core and the plurality of electrically conductive windings are interposed between the base structure and the other base structure.

Overview of Embodiments

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure, if desired supported by thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, and a substrate (in particular an IC substrate).

In the context of the present application, the term "printed circuit board" (PCB) may particularly denote a component carrier (which may be plate-shaped (i.e. planar), three-dimensionally curved (for instance when manufactured using 3D printing) or which may have any other shape) which is formed by laminating several electrically conductive layer structures with several electrically insulating layer structures, for instance by applying pressure, if desired accompanied by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing spheres (such as glass spheres).

In an embodiment, the at least one electrically insulating layer structure comprises at least one of the group consisting of resin (such as reinforced or non-reinforced resins, for instance epoxy resin or Bismaleimide-Triazine resin, more specifically FR-4 or FR-5), cyanate ester, polyphenylene derivate, glass (in particular glass fibers, multi-layer glass, glass-like materials), prepreg material, polyimide, polyamide, liquid crystal polymer (LCP), epoxy-based Build-Up Film, polytetrafluoroethylene (Teflon), a ceramic, and a metal oxide. Reinforcing materials such as webs, fibers or spheres, for example made of glass (multilayer glass) may be used as well. Although prepreg or FR4 are usually preferred, other materials may be used as well. For high frequency applications, high-frequency materials such as polytetrafluoroethylene, liquid crystal polymer and/or cyanate ester resins may be implemented in the component carrier as electrically insulating layer structure.

In an embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular coated with supra-conductive material such as graphene.

The at least one component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element or a ferrimagnetic element, for instance a ferrite core) or may be a paramagnetic element. However, the component may also be a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected together by applying a pressing force, if desired accompanied by heat.

In the context of the present application, the term "base structure" may particularly denote a plate like solid (in particular insulating) material (made from one or more layers) which may or may not (inside and/or at at least one surface) comprise conductive traces, and/or electronic components. A base structure has a main surface whose extension is at least 10 times, in particular 100 times as great as the thickness. A base structure can be understood as a carrier for electrical connections and/or electrical networks as well as component carrier comparable to a printed circuit board (PCB). A "base structure" may also comprise or be a substrate.

The electrically conductive windings together with the magnetic core may for example form an inductor or a transformer. The component carrier may carry other electronics and/or electric components and/or integrated circuits which may be electrically connected to form a circuit, or a device, such as in particular a converter such as a DC/DC converter for converting a DC input voltage into a DC output voltage having a smaller or larger voltage.

The magnetic core may be considered as any structure or body comprising magnetic material. Thereby, the magnetic material may be considered to comprise a material which is magnetizable, such as a ferromagnetic, a ferrimagnetic or at least a paramagnetic material, such as Fe, Ni, Co or an alloy of ferromagnetic, ferrimagnetic and/or paramagnetic materials. The magnetic material may in particular be a soft magnetic material having a high maximal relative permeability for example larger than 10, in particular between 10 and 100000, further in particular between 10000 and 100000. Thereby, the relatively permeability pr is the ratio of the permeability of the material to the permeability of the free space. The material of the magnetic core may for example comprise an amorphous metal alloy (such as Metglas) (having for example a relative permeability of 10000 to 1 million), iron (having a relative permeability of around 200000), nanoperm (having a permeability of around 80000), µ-metal (having a permeability between 20000 and 50000) or other materials. Any material which is also used in a conventional transformer as a core material may be used.

According to an embodiment of the present invention, the magnetic core is made of a soft magnet material having a high maximum DC magnetic permeability, in particular between $10^2$ and $10^6$ or between $10^5$ and $10^7$, the material in particular comprising a (poly)crystalline and/or an amorphous, in particular cobalt-based, metal alloy, the material in particular comprising at least one of Co, Ni, Si, Fe, Mo, mu-metal, a type of MetGlas, a type of Vitrovac.

The magnetic core may be pre-fabricated and may be connected to the base structure. In other embodiments, the magnetic core may be built directly on the base structure, for example by 3D-printing, applying chemical vapor deposition, or other deposition methods. The magnetic core may have any desired shape, as required by the particular application. The magnetic core may for example consist of a flat piece of magnetic material, such that the thickness of the magnetic core is smaller than the lateral extent parallel to a main surface of the base structure. The main surface of the base structure may thereby be defined as the surface of the base structure having the largest extension.

The magnetic core in other embodiments may comprise at least one protrusion. In other embodiments, the magnetic core may have a still more complicated shape including for example more than one protrusion. Each of the protrusions may act as a core in a coil which may be formed by the plurality of electrically conductive windings.

The base structure and/or the at least one dielectric layer may comprise prepreg which comprises pre-impregnated fibers, such as glass fibers, carbon fibers or composite fibers.

The prepreg further comprises a thermosetting polymer matrix, such as epoxy resin. The fibers may be arranged for example in a form of a weave. The thermosetting matrix material may only partly be cured for easy handling. When used in the manufacturing method, the dielectric layer may be prepreg or may comprise prepreg for example in the so-called B-stage where the prepreg is partly cured and relatively dry so that it can easily be handled. After assembling the stack, a pressure and temperature may be applied in order to fully cure the prepreg, such as polymerization occurs thereby bonding the different layers in particular also the base structure together.

The through hole may for example be punched, be cut using a knife, be mechanically routed or may be formed using a laser beam. The through hole may have a shape which may correspond to or be equal to a cross-sectional shape of the magnetic core such that the magnetic core can slide into the through hole. The plurality of electrically conductive windings may for example be formed by at least one copper trace on one dielectric layer or several copper traces on several dielectric layers which are stacked. The electric copper traces on different dielectric layers (if present) may be connected for example using plated through holes or vias. In each dielectric layer, an arbitrary number of conductive windings may be present, for example more than one winding, in particular between one winding and 100 windings. For example, one to six dielectric layers may have such electrically conductive windings which may all be connected to each other to form a coil. The conductive windings may for example, in each of the dielectric layers, have a shape as a substantially rectangular spiral or quadratic spiral or circular spiral or any shape other than spiral, e.g. fractal like. The electrically conductive windings in each layer may for example be formed by etching portions of a copper cover dielectric layer using conventional etching methods for forming copper traces on a dielectric layer.

The base structure having the magnetic core, the at least one dielectric layer and the other base structure may be stacked on top of each other to form the stack, in particular after the magnetic core has been formed on the base structure, after the through hole has been formed in the dielectric layer and after the plurality of electrically conductive windings are formed on the at least one dielectric layer.

Finally, the magnetic core including the electrically conductive windings may be completely embedded within the stack. Thereby, an integrated inductor or an integrated transformer may be made. When further electric and/or electronic components are also comprised in the component carrier, a more complex circuit or device may be manufactured. Thereby, a component carrier having high mechanical strength and high reliability in terms of mechanical and/or electrical/electronic integrity and having a small side and improved electrical performance may be achieved. Further, the component carrier may be resistant to thermal and/or mechanical stress.

According to an embodiment of the present invention, the method may further comprise forming at least one other dielectric layer having another through hole, wherein the stack further comprises the at least one other dielectric layer such that the magnetic core is inserted into the other through hole.

The other dielectric layer may substantially be comprised of the same material as the dielectric layer, such as for example prepreg. However, the other dielectric layer may not have thereon electrically conductive windings. The at least one other dielectric layer may for example be provided to be directly in contact with the base structure in the case where the magnetic core comprises more than one protrusion which protrusions are connected with each other by a connecting portion of the magnetic core. The connecting portion may have a particular height protruding from the base structure. The protrusions of the magnetic core may then protrude from the connecting portion of the magnetic core. Thus, the electrically conductive windings may only be present in a vertical position farther away from the base structure surface than the height of the connecting portion of the magnetic core. Therefore, to provide a spacer, the other dielectric layer not having any electrically conductive winding may be utilized in an advantageous manner. Depending on the height of the connecting portion of the magnetic core (if present), one or more other dielectric layers may be stacked onto the base structure. The one or more other dielectric layers may have the other through hole such as in particular allowing the connecting portion of the magnetic core to be inserted thereto. The other through hole may have a shape different from the shape of the through hole. In particular, the other through hole may have a shape corresponding to a cross-sectional shape of the connecting portion of the magnetic core (if present) combined with cross-sectional shapes of the connecting protrusions, while the through hole may have a shape corresponding to a cross-sectional shape to a protrusion of the magnetic core (if present). The connecting portion of the magnetic core may advantageously magnetically connect at least two protrusions (if present) of the magnetic core, thereby enhancing a performance of a transformer, for example.

According to an embodiment of the present invention, a sum of thicknesses of the at least one dielectric layer with the conductive windings and the at least one other dielectric layer, if present, substantially equals a height of the magnetic core protruding from the base structure.

When the sum of the thicknesses of the at least one dielectric layer with the conductive windings and the at least one other dielectric layer, if present, substantially equals a height of the magnetic core protruding from the (main surface of the) base structure, the inductor or transformer formed by the magnetic core and the electrically conductive winding may be fully embedded within the stack. Thereby, the mechanical strength may be improved.

According to an embodiment of the present invention, the magnetic core has an I-shape comprising one protrusion, or an U-shape comprising two protrusions and in particular one connecting portion, or an E-shape, comprising three protrusions and in particular one connecting portion, or a shape having more than three protrusion and in particular one connecting portion, wherein the at least one dielectric layer and the at least one other dielectric layer, if present, has for every protrusion of the magnetic core a through hole into which the respective protrusion is inserted and the plurality of electrically conductive windings is arranged respectively around each through hole on the at least one dielectric layer.

In other embodiments, the magnetic core may have still another shape. Each of the protrusions may effectively act as a magnetic core for a coil formed by the electrically conductive windings. A transformer may advantageously for example comprise a magnetic core having a U-shape, or an E-shape. Thereby, at least one inductor and in particular differently configured transformers may be built in an integrated manner within the stack.

According to an embodiment of the present invention, in particular if the magnetic core comprises at least two protrusions, the method further comprises: forming on the other base structure a magnetic connection structure or another magnetic core; wherein the stack is formed such that the magnetic connection structure (magnetically) connects the at least two protrusions of the magnetic core, wherein the other base structure having the other magnetic core is in particular constructed substantially mirror-symmetrically as the base structure having the magnetic core.

The other base structure may substantially be configured regarding material and/or shape as the base structure. The magnetic connection structure may enable to magnetically connect at least two protrusions, if present, of the magnetic core which is formed on the base structure. Thereby, a magnetic circuit may be closed having advantages for building a transformer for example. The other magnetic core may substantially also comprise (thus dispensing with the magnetic connection structure) a magnetic connection portion (as the magnetic core may comprise). Therefore, also connecting the magnetic core with the other magnetic core may enable to build a pattern of magnetically connected/coupled protrusions. When there is a substantial mirror symmetry, the magnetic core on the base structure may be manufactured in a same manner as the other magnetic core on the other base structure, thereby simplifying the manufacturing.

According to an embodiment of the present invention, the stack is formed such that the base structure and the other base structure sandwich the magnetic core, the other magnetic core or magnetic connection structure, the plurality of electrically conductive windings, the at least one dielectric layer and the at least one other dielectric layer, if present, therebetween, the stack in particular satisfying substantially a mirror-symmetry which respect to a middle plane of the stack. The sandwiching of those components may improve the mechanical strength and thermal resistivity of the assembly. When a mirror symmetry is present, the manufacturing may still be simplified.

According to an embodiment of the present invention, the stack embeds the magnetic core, the other magnetic core or the magnetic connection structure, if present, the plurality of conductive windings, the dielectric layer and the other dielectric layer, if present.

According to an embodiment of the present invention, at least one of the protrusions and/or at least one of the through holes has a rectangular, circular or oval cross-sectional shape, and/or wherein the plurality of electrically conductive windings are formed on a plurality of dielectric layers.

When the through hole has a rectangular shape, advantageously the plurality of conductive windings may be formed as a rectangular or quadratic spiral comprising straight sections of copper traces which may be simply manufactured. When the plurality of electrically conductive windings are formed on a plurality of dielectric layers (such as two, three, four, five or six or even more layers), an inductance of the inductor may be increased which may be required for particular applications.

According to an embodiment of the present invention, forming the magnetic core on the base structure and/or forming the other magnetic core or magnetic connection structure on the other base structure comprises 3D printing of the magnetic core on the base structure; plating, in particular electroplating, and/or electroless plating, and/or using chemical vapor deposition, the magnetic core on the base structure; and/or connecting, e.g. by soldering such as on a conductive surface (e.g. copper) and/or using adhesive, a pre-manufactured magnetic core with the base structure; and/or selective laser melting the magnetic core on the base structure; and/or selective laser sintering the magnetic core on the base structure; and/or fused deposition modeling the magnetic core on the base structure.

For 3D printing, magnetizable material in powder form may be fixed with a matrix material which may be fluid for 3D printing and which may then solidify (in particular cure or polymerize) over time, in particular when a heat treatment is performed over a particular time range. Plating may be performed in any known conventional manner. The pre-manufactured magnetic core may be in a solid form and may be glued onto the surface of the base structure. When a solid magnetic core is connected to the base structure, the shape of the magnetic core may be further refined or altered when already connected to the base structure. Other methods for forming the magnetic core on the base structure are possible.

According to an embodiment of the present invention, the base structure or other base structure comprises a copper foil, and/or comprises at least one layer made of dielectric material, in particular made of prepreg, or comprises a prepreg core, wherein the dielectric layer is in particular made of prepreg.

When the base structure comprises a copper foil, the magnetic core may be formed directly on the copper foil, thereby enhancing connection strength. Furthermore, a copper foil covered base structure may be conventionally easily available, thereby simplifying the manufacturing and reducing costs. In particular, the base structure may be or comprise at least one prepreg layer having copper on each of the main surfaces which may be called a core. Thereby, also the base structure may be structured regarding the copper coverage on the same plane of the magnetic core, gaining in space and hence resulting in miniaturization. Usage of these materials or conventionally available elements may reduce costs and time of the manufacturing process.

According to an embodiment of the present invention, the magnetic core together with the plurality of conductive windings and, if present, the other magnetic core or the magnetic connection structure, form a transformer. Thereby, a transformer fully embedded into the stack and thus protected and potentially integrated with other electronic and electric elements may be achieved.

According to an embodiment of the present invention, the plurality of electrically conductive windings forms at least one coil having a coil axis substantially perpendicular to a main surface of the at least one dielectric layer or the base structure.

In the prior art, it may have been possible to provide a partially embedded coil having a coil axis parallel to a main surface of a printed circuit board but not having a coil axis substantially perpendicular to a main surface of a printed circuit board. The configuration as now provided may simplify manufacturing and lower costs.

It should be understood that features individually or in any combination disclosed, described or explained for a method of manufacturing a component carrier (in particular with integrated inductor) may also apply, individually or in any combination, to a component carrier according to an embodiment of the present invention and vice versa.

According to an embodiment of the present invention it is provided a component carrier, comprising a stack, the stack comprising a base structure having the magnetic core thereon; at least one dielectric layer having a through hole and a plurality of electrically conductive windings thereon around the through hole; and another base structure, the base structure with the magnetic core, the at least one dielectric layer and the other base structure being stacked such that the magnetic core is inserted into the through hole and the windings are arranged around the magnetic core such that the magnetic core and the plurality of electrically conductive windings are interposed between the base structure and the other base structure.

According to an embodiment of the present invention the component carrier further comprises at least one of the following components embedded within the stack: a switch, in particular transistor; a driver integrated circuit; a capacitor; a diode, the components in particular being electrically connected to form a DC/DC converter.

To finalize the component carrier, the assembled stack may be pressed to connect the layers and the base structure and the other base structure with each other in order to solidify, cure and polymerize in particular the prepreg layers.

According to other embodiments of the present invention the component carrier further comprising a component, in particular an electronic component, mounted on and/or embedded in the at least one electrically insulating layer structure and/or the at least one electrically conductive layer structure.

According to other embodiments of the present invention the component is selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier and a logic chip.

According to other embodiments of the present invention the at least one electrically conductive layer structure comprises at least one of the group consisting of copper, aluminum, nickel, silver, gold, palladium, and tungsten, any of the mentioned materials being optionally coated with supra-conductive material such as graphene.

According to other embodiments of the present invention the at least one electrically insulating layer structure comprises at least one of the group consisting of resin, in particular reinforced or non-reinforced resin, for instance epoxy resin or Bismaleimide-Triazine resin, FR-4, FR-5, cyanate ester, polyphenylene derivate, glass, prepreg material, polyimide, polyamide, liquid crystal polymer, epoxy-based Build-Up Film, polytetrafluoroethylene, a ceramic, and a metal oxide.

According to other embodiments of the present invention wherein the component carrier is shaped as a plate.

According to other embodiments of the present invention the component carrier is configured as one of the group consisting of a printed circuit board, and a base structure.

According to other embodiments of the present invention the component carrier is configured as a laminate-type component carrier.

Embodiments of the present invention are now described with reference to the accompanying drawings. The invention is not restricted to the illustrated or described embodiments.

The aspects defined above and further aspects of the present invention are apparent from the examples of embodiment to be described hereinafter and are explained with reference to the examples of embodiment. The invention will be described in more detail hereinafter with reference to examples of embodiment but to which the invention is not limited.

DETAILED DESCRIPTION OF ILLUSTRATED EMBODIMENTS

Reference signs indicating same or similar elements in structure and/or function are labeled in the different drawings with reference signs only differing in the first digit.

Figure 1A:
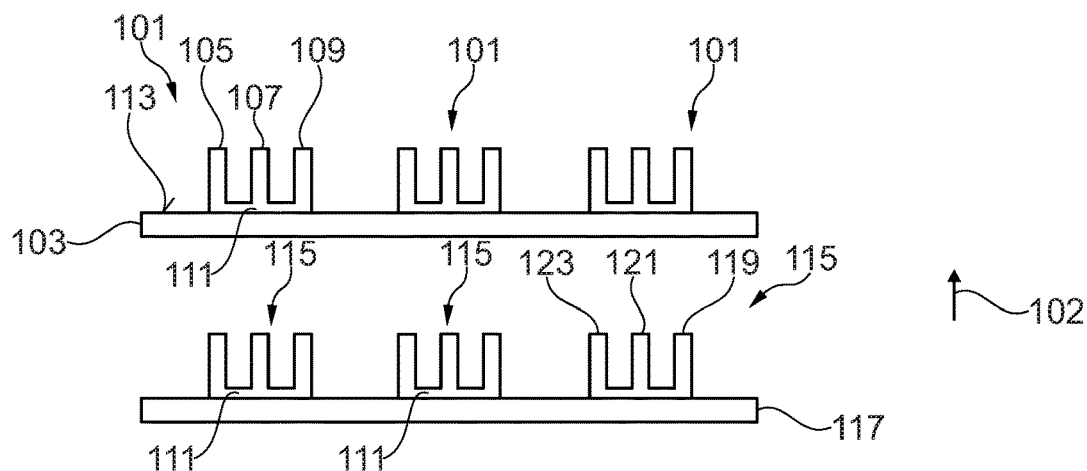
FIGS. 1A, 1B and 1C schematically illustrate in a side view method steps of a method for manufacturing a component carrier according to an embodiment of the present invention.

The FIGS. 1A, B and C schematically illustrate steps of a method of manufacturing a component carrier 100 according to an embodiment of the present invention. In the manufacturing step illustrated in FIG. 1A, a magnetic core 101 is formed on a base structure 103. In the embodiment illustrated in FIG. 1, the magnetic core has an E-shape comprising three protrusions 105, 107, 109. The magnetic core 101 illustrated in FIG. 1 further comprises a connecting portion 111 which connects all three protrusions 105, 107, 109 and is attached directly to a main surface 113 of the base structure 103. For mass production, in fact three magnetic cores 101 are illustrated as being formed on the base structure 103.

Furthermore, in the method step illustrated in FIG. 1A, another magnetic core 115 is formed on another base structure 117, wherein the other magnetic core 115 comprises also three protrusions 119, 121, 123. The other magnetic core has mirror symmetry with respect to the magnetic core 101 so that ends of the protrusions 105, 107, 109 of the magnetic core 101 can be aligned with ends of the protrusions 119, 121, 123 when the other base structure 117 including the other magnetic core 115 is flipped by 180° rotated around a rotation axis perpendicular to the drawing page of FIG. 1A.

Figure 1B:
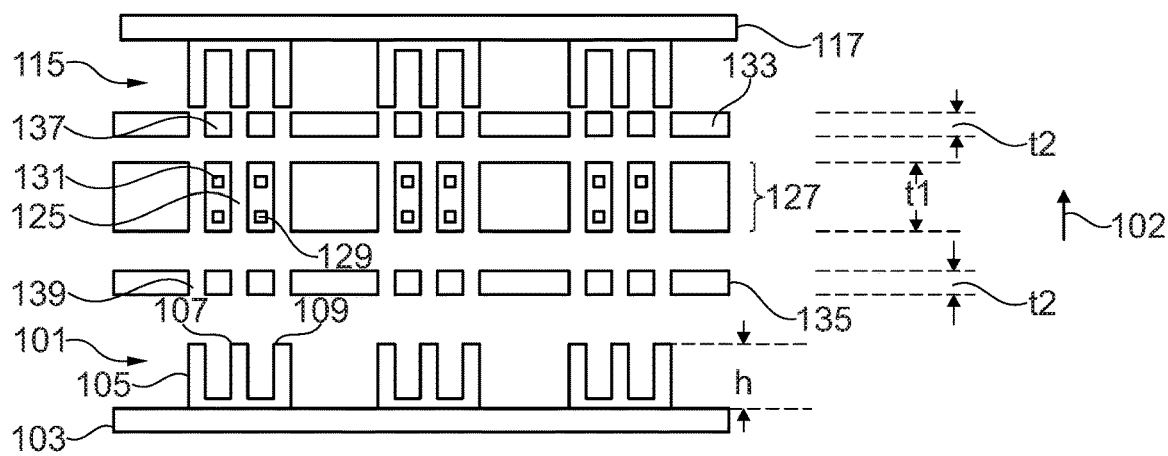

In the next method step, as illustrated in FIG. 1B, a through hole 125 is formed in at least one dielectric layer 127. The at least one dielectric layer 127 comprises multiple prepreg layers, but may only comprise one prepreg layer, for example. On the at least one dielectric layer 127, a plurality of electrically conductive windings 129 is formed. In the embodiment illustrated in FIG. 1, these windings 129 are only schematically illustrated. The windings 129 may comprise plural turns in one plane of one of the dielectric layers comprised in the dielectric layers 127. In the illustrated embodiment, two dielectric layers of the dielectric layers 127 comprise plural electrically conductive windings, namely the windings 129 and the windings 131 in an adjacent layer on top of the windings 129. More dielectric layers having each plural conductive windings may be stacked depending on the particular application. The height h of the protrusion 105 is the sum of the thickness t2 of layer 135 and half the thickness t1 of the layers 127.

In the embodiment illustrated in FIG. 1, at least one other dielectric layer 133 is further formed which does not include any electrically conductive windings. In fact, even a further other dielectric layer 135 is formed. In both the other dielectric layers 133, 135, a through hole 137, 139, respectively, is formed.

Figure 1C:
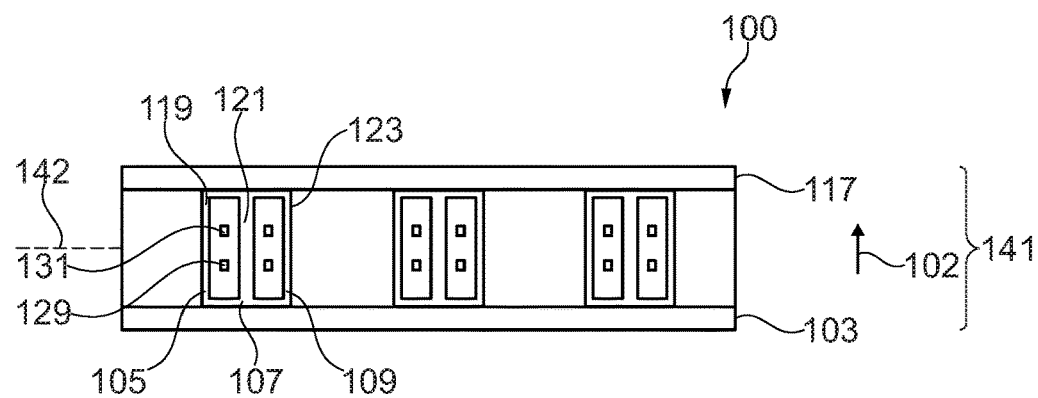

Further, the other base structure 117 comprising the other magnetic core 115 is flipped compared to the illustration in FIG. 1A by 180° and the base structure 103 having the magnetic core 101, the further other dielectric layer 135, the at least one dielectric layer 137 comprising the electrically conductive windings 129, 131, the other dielectric layer 133 and the other base structure 117 having the other magnetic core 115 are stacked on top of each other and pressed together resulting in the component carrier 100 as is illustrated in FIG. 1C. Thereby, as can be appreciated from FIG. 1C, at least an inductor or a transformer 110 is achieved which is fully encapsulated within the stack 141.

As can be taken from FIG. 1C, the electrically conductive windings 129, 131 are arranged around the protrusions 107 of the magnetic core 101 and the protrusion 121 of the other magnetic core 115. In other embodiments, other conductive windings may also be arranged around one or more of the other protrusions such as protrusions 105, 119 or protrusions 109, 123. Thereby, different types of transformers may be built.

Figure 2A:
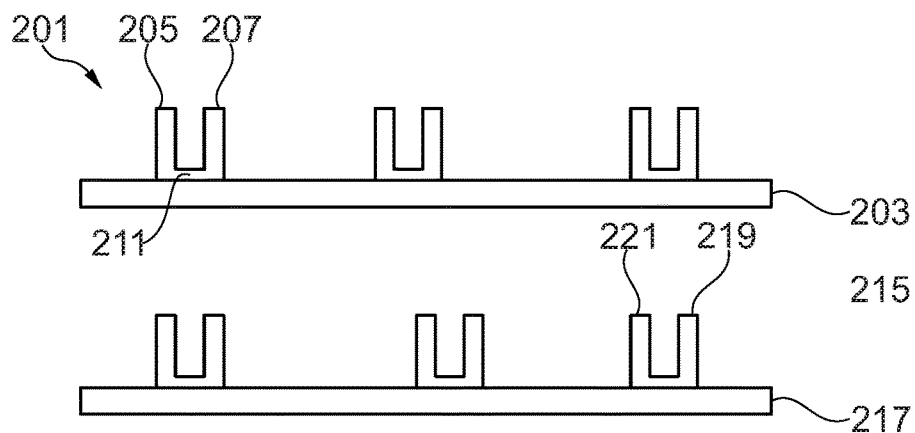
FIGS. 2A, 2B and 2C schematically illustrate in a side view method steps of a method for manufacturing a component carrier according to an embodiment of the present invention.
Figure 2B:
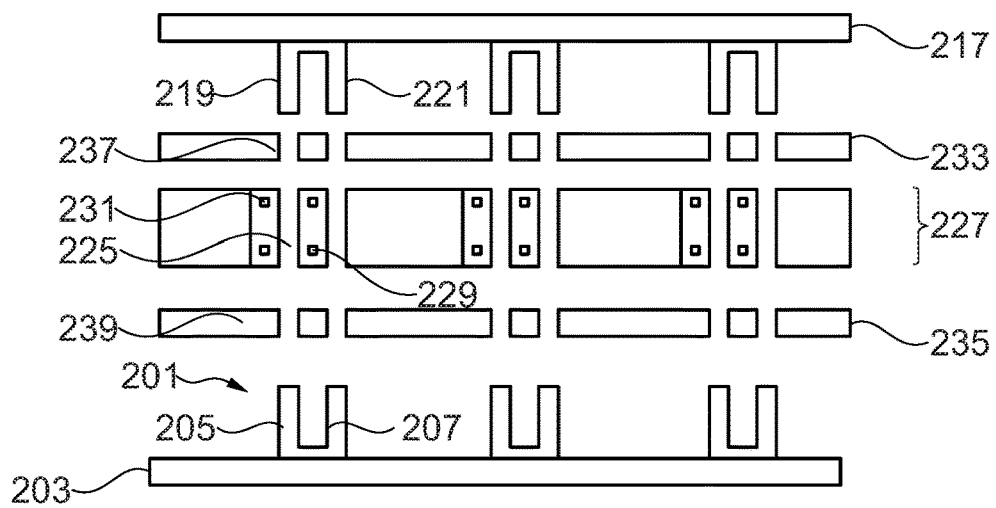
Figure 2C:
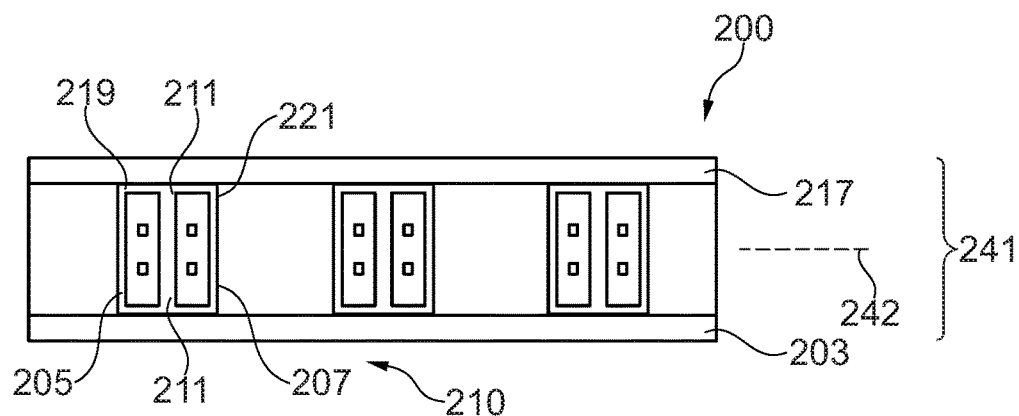

FIGS. 2A to 2C schematically illustrate in side views manufacturing steps of manufacturing a component carrier according to another embodiment of the present invention. The component carrier 200 resulting from the manufacturing method illustrated in FIGS. 2A, 2B differs from the component carrier 100 resulting from the manufacturing method illustrated in FIGS. 1A, B and C in that the component carrier 200 comprises a magnetic core 201 having only two protrusions 205 and 207 and that the other magnetic core 215 on the other base structure 217 has only two protrusions 219 and 221. Other method steps are similar to those illustrated in FIGS. 1A, 1B and 1C. Also, further electrically conductive windings may be arranged around the protrusions 207, 221, for example for providing a primary coil and an additional secondary coil thereby achieving a transformer.

Figure 3A:
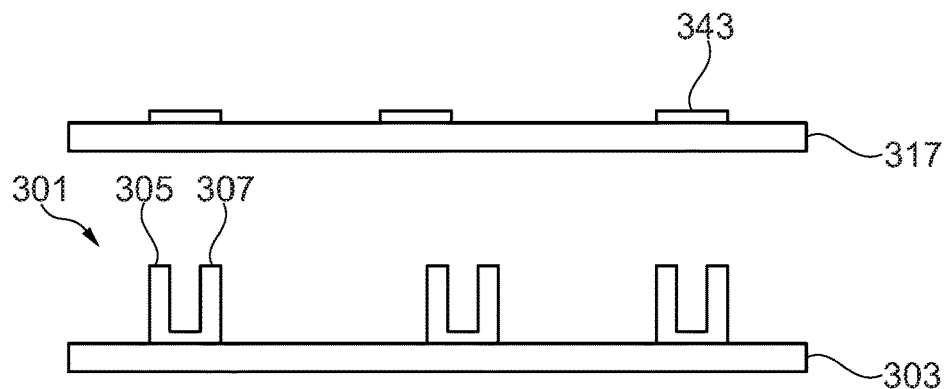
FIGS. 3A, 3B and 3C schematically illustrate in a side view method steps of a method for manufacturing a component carrier according to an embodiment of the present invention.
Figure 3B:
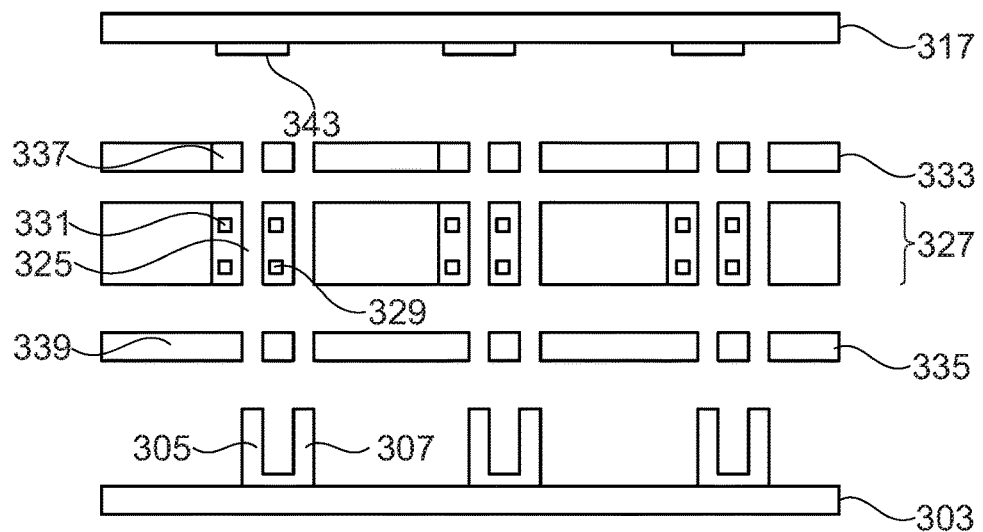
Figure 3C:
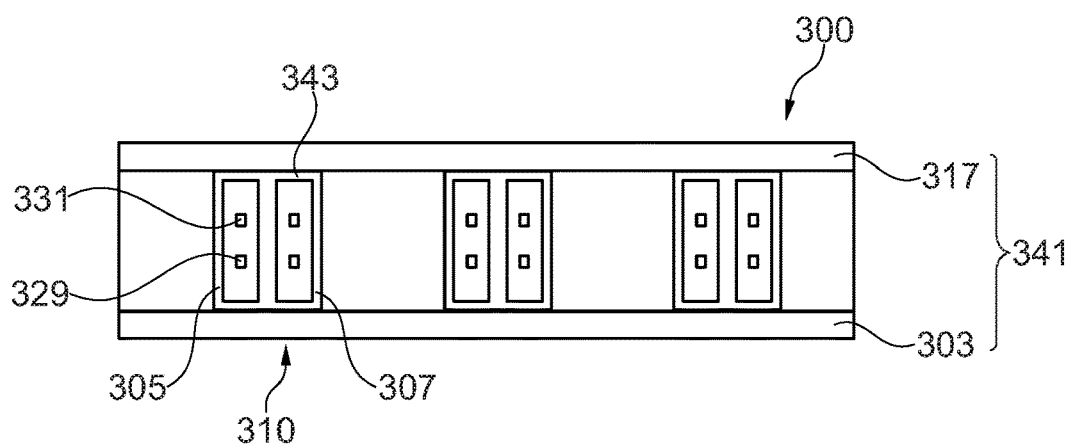

FIGS. 3A, 3B and 3C schematically illustrate manufacturing steps according to another embodiment of the present invention for achieving still another component carrier 300 according to an embodiment of the present invention. The base structure 303, similarly to the base structure 201 illustrated in FIG. 2, has formed a magnetic core 301 thereon having two protrusions 305, 307. The other base structure 317, however, comprises a magnetic connection structure 343 represented for example by a bar or a relatively thin plate being attached to the other base structure 317. As in the previously described embodiments, the other base structure having the magnetic connection 343 is flipped by 180° and a stack 341 is formed such that the magnetic connection structure 343 magnetically connects/couples the protrusions 305, 307 of the magnetic core 301 which is formed on the base structure 303. As has been explained above, also further electrically conductive windings may be arranged for example around the protrusion 307 in order to for example create a primary and a secondary coil of a transformer 310.

Figure 4A:
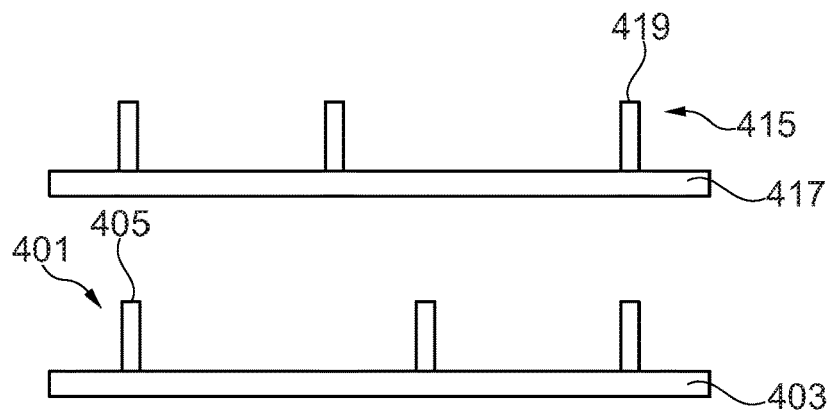
FIGS. 4A, 4B and 4C schematically illustrate in a side view method steps of a method for manufacturing a component carrier according to an embodiment of the present invention.
Figure 4B:
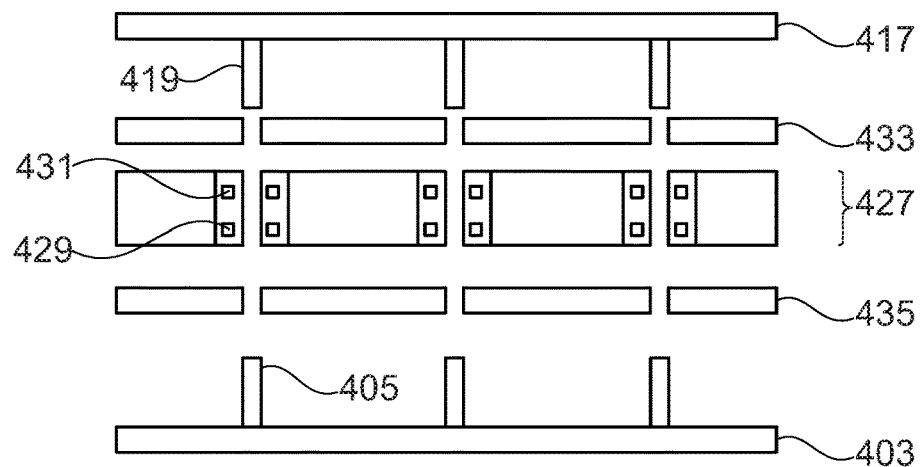
Figure 4C:
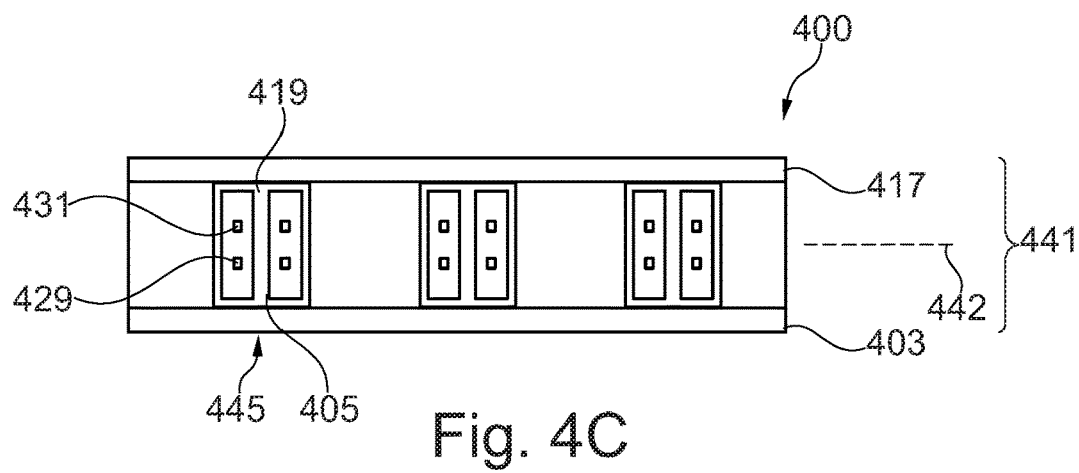

FIGS. 4A, 4B, 4C schematically illustrate in side views manufacturing steps for creating a component carrier 400 according to an embodiment of the present invention. In the embodiment illustrated in FIG. 4, the base structure 403 has formed thereon a magnetic core 401 having only one protrusion 405. Furthermore, the other base structure 417 has formed thereon another magnetic core 415 also having only one protrusion 419. After flipping one of the base structure 403 or the other base structure 417 as explained before, and stacking the base structures and the dielectric layers, the protrusion 405 formed on base structure 403 align with the protrusion 419 formed on the other base structure 417 and the electrically conductive windings 429 and 431 are arranged the thereby created rod-like magnetic core. Thereby, an inductor 445 is created.

The component carriers 100, 200, 400 illustrated in FIGS. 1, 2 and 4, respectively, are mirror-symmetric with respect to a plane 142, 242, 442, respectively, which is a mid-plane of the stack 141, 241, 441, respectively, thus, a plane parallel to the main surface 113 of the base structure 103 or the other base structure 117 and placed in a vertical center.

Figure 5A:
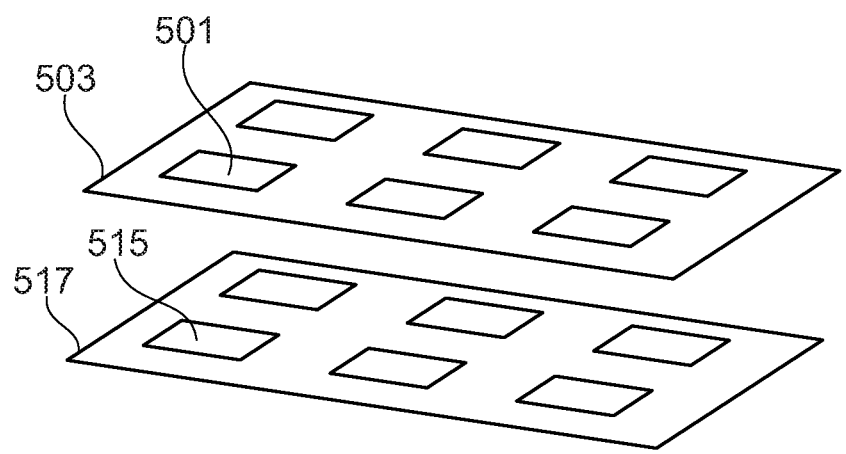
FIGS. 5A, 5B and 5C schematically illustrate in perspective views steps of a method of manufacturing a component carrier generically applying to FIGS. 1 to 4.
Figure 5B:
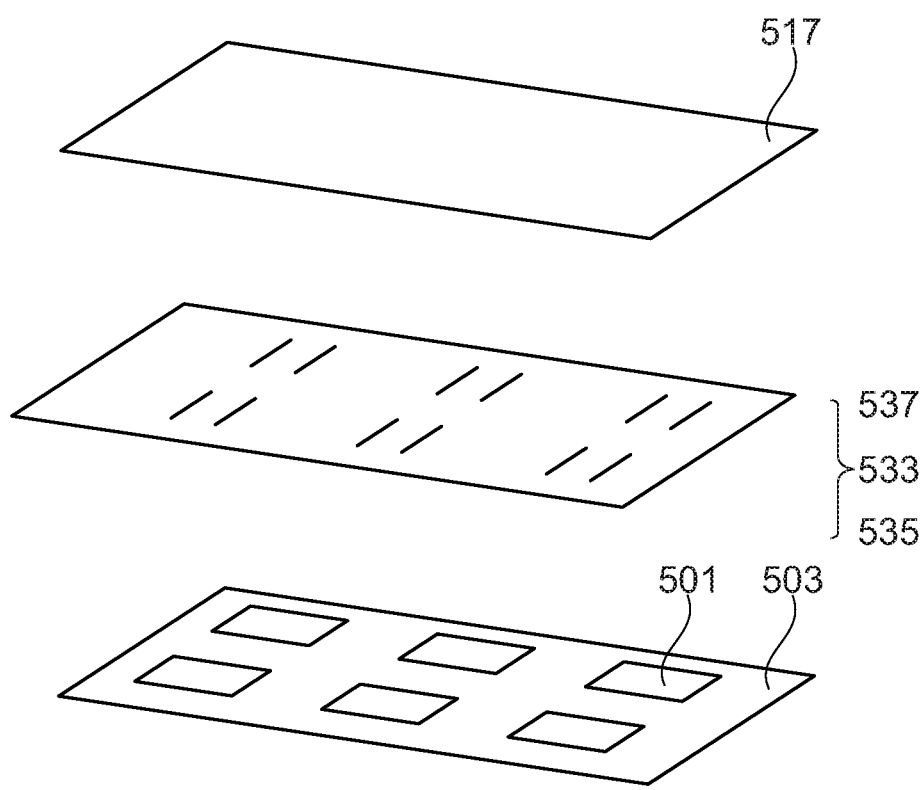
Figure 5C:
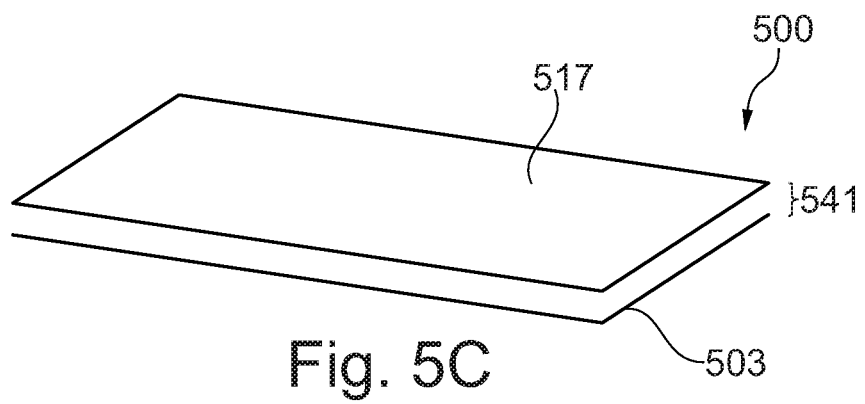

FIGS. 5A, 5B, 5C schematically illustrate the manufacturing steps in schematic perspective views wherein the magnetic core 501 formed on the base structure 503 and the magnetic core 515 formed on the other base structure 517 are only schematically illustrated without depicting in detail the shape of the magnetic cores. Furthermore, the at least one dielectric layer 527 and the other dielectric layers 533, 535 are only schematically illustrated without depicting details. The stack 541 as achieved in FIG. 5C thereby represents the component carrier 500.

Figure 6:
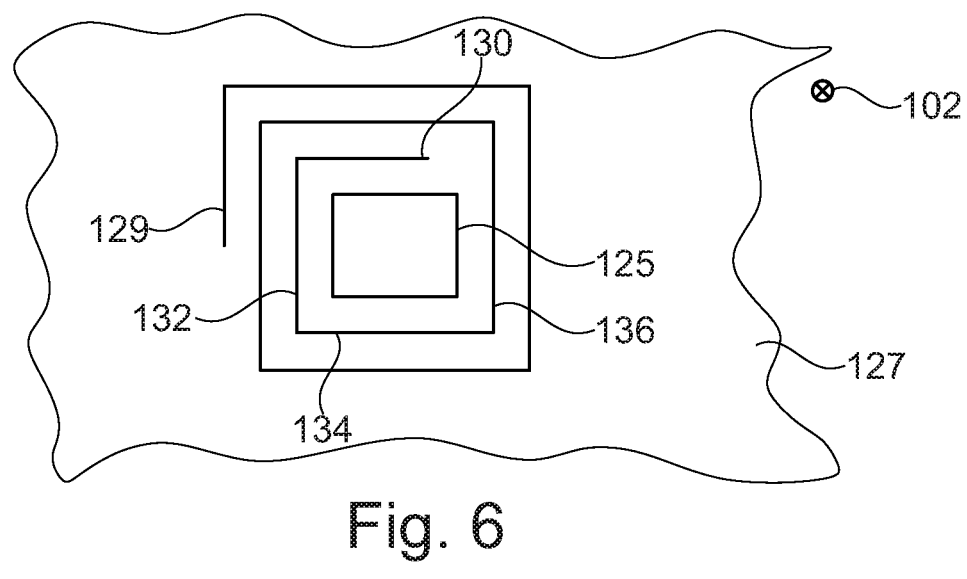
FIG. 6 schematically illustrates an elevational or frontal view of a dielectric layer comprising conductive windings as used in the component carriers as manufactured according to one of FIGS. 1 to 5.

FIG. 6 schematically illustrates an elevational view along a vertical direction 102 as illustrated in FIG. 1 of one of the at least one dielectric layer 127 illustrated in FIGS. 1B and 1C. The at least one dielectric layer 127 comprises a through hole 125 which in the illustrated embodiment has a quadratic shape. Around the through hole 125, the dielectric layer 127 has formed thereon a copper trace 129 which is formed as a quadratic spiral comprising straight sections 130, 132, 134, 136 mutually perpendicular to mutually adjacent sections. In other embodiments, the through hole 125 may have a rectangular, circular or oval shape and also the conductive windings 129 may have a compatible spiral shape. The shape of the through hole 125 corresponds to a shape of a sectional view of one of the protrusions 105 of the magnetic core 101.

Figure 7:
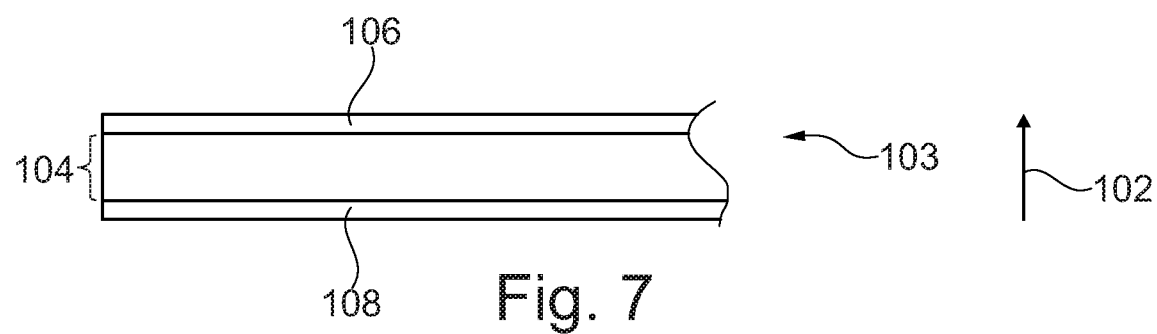
FIG. 7 schematically illustrates in a side view a base structure which may be used for a component carrier according to one embodiment of the present invention.

FIG. 7 schematically illustrates a side view of a base structure 103 according to an embodiment of the present invention as can be used in embodiments of the component carrier as illustrated in one of the former figures. The base structure 103 comprises a prepreg portion 104 comprising plural layers being covered with a copper foil 106 and 108 at both sides. According to an embodiment of the present invention, the magnetic core 101 or the other magnetic core 115 may be formed directly on the copper foil 106 or 108.

Figure 8:
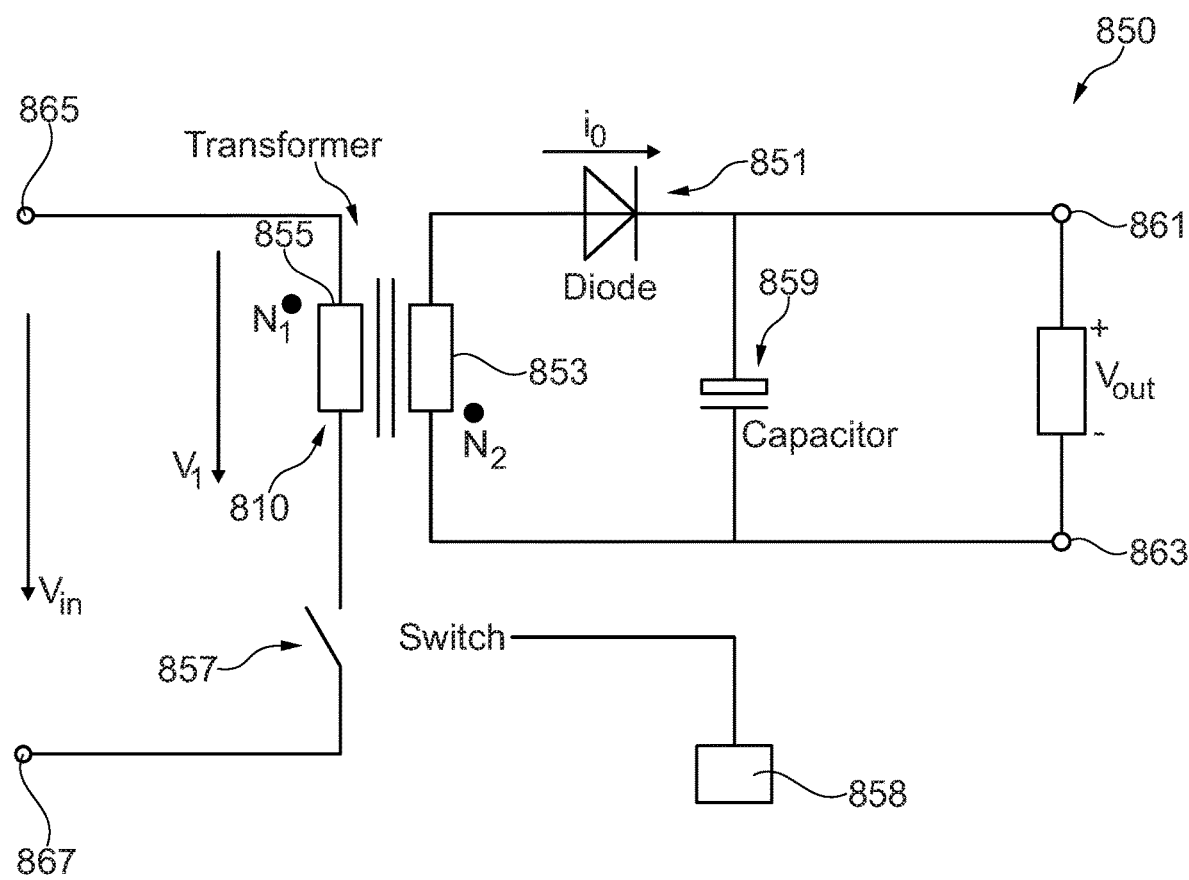
FIG. 8 illustrates a circuit diagram of a DC/DC converter as may be integrated into a stack of a component carrier according to an embodiment of the present invention.

The component carriers 100, 200, 300, 400, 500 illustrated in FIGS. 1 to 5 may further comprise other electronic components such as those illustrated schematically in a circuit diagram in FIG. 8 and connected such as to form a DC/DC converter 850. The DC/DC converter 850 comprises a transformer 810, for example transformer 110, 210, 310 as illustrated in FIGS. 1, 2 and 3, respectively, integrated in a stack of layers. Further, the converter 850 comprises a diode 851 connected to a secondary winding 853 of the transformer 810. The transformer 810 comprises a primary winding 855 which is wound around a not illustrated core and is connected via a switch 857 to an input DC voltage Vin. The switch may be for example a MOSFET also integrated in the component carrier illustrated in one of the former figures. The driver integrated circuit 858 provides drive signals to the switch 857. The DC/DC converter 850 further comprises a capacitor 859 connected in parallel to the secondary coil 853. The converted voltage can be output or applied at output terminals 861, 863 parallel to the capacitor 859. The input voltage Vin is provided at input terminals 865, 867. The complete DC/DC converter 850 may for example be realized in a component carrier according to an embodiment of the present invention, such as component carriers 100, 200, 300, 400 or 500.

A DC/DC converter may be used in a low power switch-mode power supply or low cost multiple-output power supply to change the input voltage from a power supply to the desired operational voltage with galvanic isolation. Common power supplies may be set to 220 V and portable devices may operate in voltage ranges between 3 and 12 V. In portable devices it may be highly desired to reduce the footprint of such circuits both in horizontal and vertical planes. According to embodiments of the present invention, integration of components required to build a DC/DC converter are integrated in a layer structure comprising magnetic cores for at least one inductor or a transformer. Furthermore, the DC/DC converter circuitry which may be integrated into a layer structure may comprise a switch, such as a MOSFET, a driver integrated circuit, at least one capacitor, at least one diode, and a transformer. All of the above-mentioned components are integrated within the layers of the printed circuit board, offering the ultimate solution. The magnetic core may comprise a soft magnetic/ferrite/magnetic material. Further shapes of the magnetic cores are rod, C-shaped, U-shaped, E-shaped, pot core, toroidal core, ring or bead or planar core. The planar core may consist of two flat pieces of magnetic material, in particular one above and one below a coil. This design may be excellent for mass production and may allow a high power, small volume transformer to be constructed for low cost.

Figure 9:
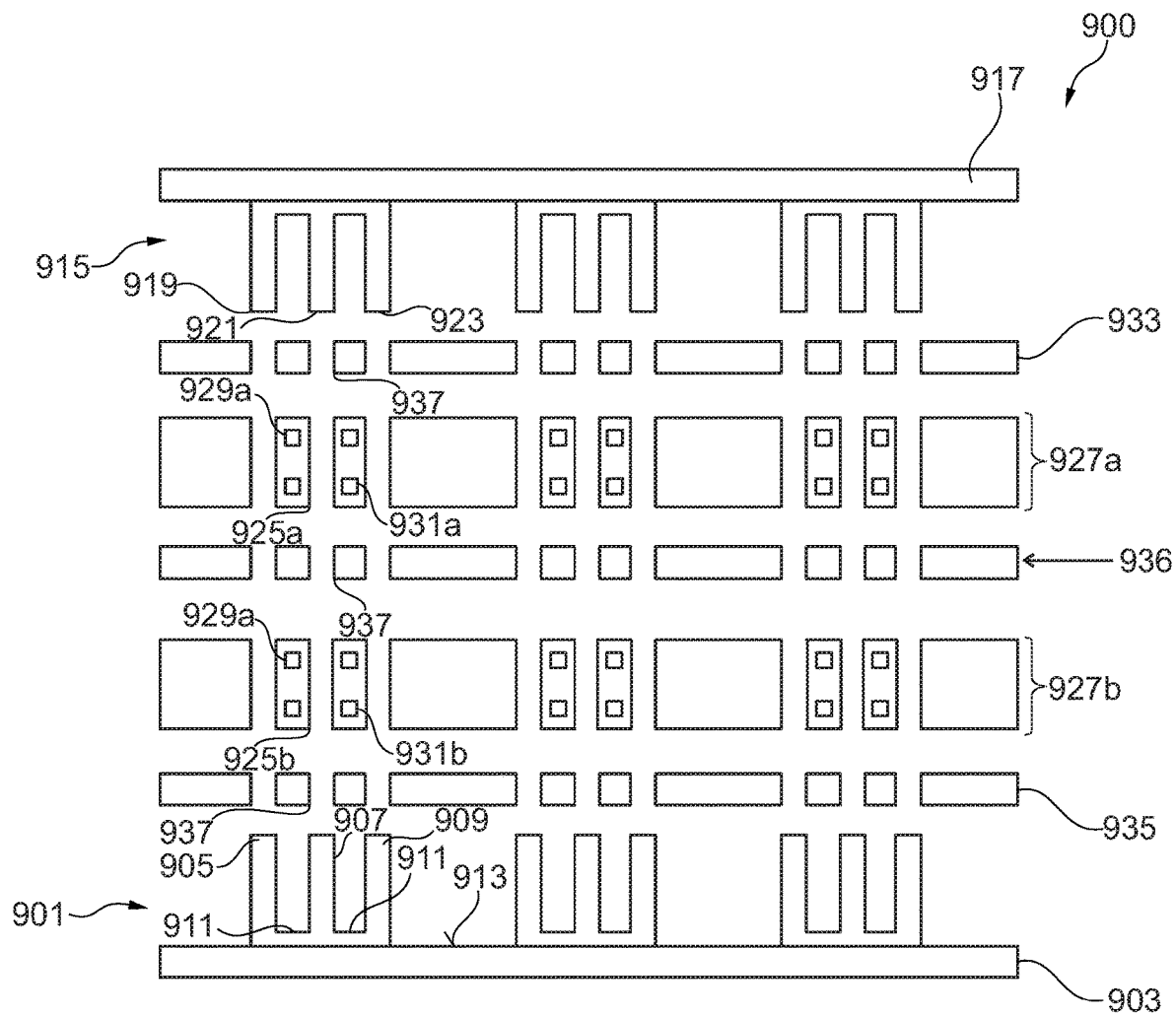
FIG. 9 schematically illustrates in a side view a component carrier according to an embodiment of the present invention.

FIG. 9 schematically illustrates in a side view a component carrier according to an embodiment of the present invention. A magnetic core 901 is formed on a base structure 903. The magnetic core 901 has an E-shape comprising three protrusions 905, 907, 909. The magnetic core 901 illustrated in FIG. 9 further comprises a connecting portion 911 which connects all three protrusions 905, 907, 909 and is attached directly to a main surface 913 of the base structure 903. Another magnetic core 915 is formed on another base structure 917, wherein the other magnetic core 915 comprises also three protrusions 919, 921, 923. The other magnetic core 915 has mirror symmetry with respect to the magnetic core 901. A through hole 925a is formed in at least one dielectric layer 127a and a through hole 925b is formed in at least one dielectric layer 127b. The at least one dielectric layer 927a, 927b each comprises multiple prepreg layers, but may only comprise one prepreg layer, for example. On the at least one dielectric layer 127a, a plurality of electrically conductive windings 929a, 931a are formed. At least one other dielectric layer 933 is further formed which does not include any electrically conductive windings. In fact, even a further other dielectric layer 935 is formed. In both the other dielectric layers 933, 935, a through hole 937, 139, respectively, is formed.

The base structure 903 having the magnetic core 901, the further other dielectric layer 935, the at least one dielectric layer 927b comprising the electrically conductive windings 129b, 131b, a dielectric layer 936 (also having through hole 937), the at least one dielectric layer 927a comprising the electrically conductive windings 129a, 131a, the other dielectric layer 933 and the other base structure 917 having the other magnetic core 915 are stacked on top of each other and pressed together resulting in the component carrier 900 as is illustrated in FIG. 9.

This will allow a modular approach in z-axis to increase the number of windings in between the protrusions of the cores. The prepregs 936 in between the cores may have two advantages: (i) mechanical connection and electrical insulation between layers, (ii) filing the gaps between protrusions and cores. The re-connection of all layers can be made with via mechanical or laser formation.

According to an embodiment to integrate such planar cores into a layer structure, first, the magnetic structures may be realized or formed on a copper foil as large as the panel is. These structures may be realized via 3D printing the magnetic material, i.e. via selective laser melting directly executed on the copper foil, selective laser sintering, fused deposition modeling with polymers having embedded magnetic particles, etc. Particularly, selective laser melting may allow a good interface adhesion between the magnetic core structure and the copper foil. The rest of the DC/DC circuitry may be realized on a panel level with embedded all the rest of the components. For simplicity, such a panel may be represented as is described in one of the embodiments above. By pressing the copper foil having the magnetic structures, dielectric and C-stage board with embedded components, the highly miniaturized isolated DC/DC converter may be obtained over the whole panel. It may then be possible to further continue with the circuitry by structuring the copper foil on both sides and, when necessary, continue rebuild up further.

Accordingly, the two copper foils having planar cores may be laminated together with pre-cut prepregs and C-stage N-layer board (N≥1). The final product may be a panel having integrated transformers and necessary circuitry. In the DC/DC converter, chopping is implemented with the standard semiconductor switch, for example MOSFET. The secondary side of the transformer may be responsible for the rectification and the filtering of the voltage signal. According to embodiments of the present invention, all components required for a circuitry comprising at least one inductor or a transformer are embedded in a layer structure.

The magnetic core may be printed in three dimensions directly on the copper foil thereby increasing the reliability ("perfect adhesion"). The magnetic core design or shape may be arbitrary, since 3D printing may be highly flexible in terms of design. It is possible to directly structure the inductor, which is the magnetic core, directly to the copper layer. This may increase the anchoring of the inductor layer into the PCB.

It is also possible to achieve a highly miniaturized package. Embodiments of the present invention may enable to create a fly-back/forward converter and derived topologies deriving from these two integrated in a layer structure. Further, a switch mode power supply with isolation is achievable.

It should be noted that the term "comprising" does not exclude other elements or steps and the use of articles "a" or "an" does not exclude a plurality. Also, elements described in association with different embodiments may be combined.

The invention claimed is:

1. A method of manufacturing a component carrier, the method comprising:
    forming a magnetic core on a base structure;
    forming a through hole in at least one dielectric layer;
    forming a plurality of electrically conductive windings on the at least one dielectric layer around the through hole; and
    forming a stack comprising the base structure having the magnetic core, the at least one dielectric layer and another base structure such that the magnetic core is inserted into the through hole and the conductive windings are arranged around the magnetic core and such that the magnetic core and the plurality of electrically conductive windings are interposed between the base structure and the other base structure.

2. The method according to claim 1, further comprising:
    forming at least one other dielectric layer having another through hole, wherein the stack further comprises the at least one other dielectric layer such that the magnetic core is inserted into the other through hole.

3. The method according to claim 2, wherein a sum of thicknesses of the at least one dielectric layer with the conductive windings and the at least one other dielectric layer substantially equals a height of the magnetic core protruding from the base structure.

4. The method according to claim 2, wherein the magnetic core has one of:
    an I-shape comprising one protrusion,
    an U-shape comprising two protrusions and one connecting portion,
    an E-shape, comprising three protrusions and one connecting portion, and
    a shape having more than three protrusion and one connecting portion, wherein the at least one dielectric layer and the at least one other dielectric layer has for every protrusion of the magnetic core a through hole into which the respective protrusion is inserted and the plurality of electrically conductive windings is arranged respectively around each through hole on the at least one dielectric layer.

5. The method according to claim 4, wherein, if the magnetic core comprises at least two protrusions, the method further comprises:
    forming on the other base structure a magnetic connection structure;
    wherein the stack is formed such that the magnetic connection structure connects the at least two protrusions of the magnetic core.

6. The method according to claim 1, the method further comprising:
    forming at least one other dielectric layer having another through hole;

forming on the other base structure another magnetic core, wherein the other base structure having the other magnetic core is constructed substantially mirror-symmetrically as the base structure having the magnetic core.

7. The method according to claim 5, wherein the stack is formed such that the base structure and the other base structure sandwich the magnetic core, the magnetic connection structure, the plurality of electrically conductive windings, the at least one dielectric layer and the at least one other dielectric layer therebetween, the stack satisfying substantially a mirror-symmetry which respect to a middle plane of the stack.

8. The method according to claim 6, wherein the stack is formed such that the base structure and the other base structure sandwich the magnetic core, the other magnetic core, the plurality of electrically conductive windings, the at least one dielectric layer and the at least one other dielectric layer therebetween, the stack satisfying substantially a mirror-symmetry with respect to a middle plane of the stack.

9. The method according to claim 6, wherein the stack embeds the magnetic core, the other magnetic core, the plurality of conductive windings, the dielectric layer and the at least one other dielectric layer.

10. The method according to claim 5, wherein the stack embeds the magnetic core, the magnetic connection structure, the plurality of conductive windings, the dielectric layer and the at least one other dielectric layer.

11. The method according to claim 4, wherein at least one of the protrusions and at least one of the through holes has one of a rectangular, circular and oval cross-sectional shape.

12. The method according to claim 1, wherein the plurality of electrically conductive windings are formed on a plurality of dielectric layers.

13. The method according to claim 1, wherein forming the magnetic core on the base structure comprises at least one of:
   3D printing of the magnetic core on the base structure;
   plating, the magnetic core on the base structure;
   plating, using chemical vapor deposition, the magnetic core on the base structure;
   connecting a pre-manufactured magnetic core with the base structure;
   selective laser melting the magnetic core on the base structure;
   selective laser sintering the magnetic core on the base structure; and
   fused deposition modeling the magnetic core on the base structure.

14. The method according to claim 1, wherein at least one of the base structure and the other base structure comprises at least one of:
   a copper foil,
   at least one layer made of dielectric material, and
   a prepreg core,
   wherein the dielectric layer is made of prepreg.

15. The method according to claim 6, wherein the magnetic core together with the plurality of conductive windings and the other magnetic core form a transformer.

16. The method according claim 5, wherein the magnetic core together with the plurality of conductive windings and the magnetic connection structure form a transformer.

17. The method according to claim 1, wherein the plurality of electrically conductive windings forms at least one coil having a coil axis substantially perpendicular to a main surface of one of the at least one dielectric layer and the base structure.

18. A component carrier, comprising:
   a stack, the stack comprising:
      a base structure having the magnetic core thereon;
      at least one dielectric layer having a through hole and a plurality of electrically conductive windings thereon around the through hole; and
      another base structure,
      the base structure with the magnetic core, the at least one dielectric layer and the other base structure being stacked such that the magnetic core is inserted into the through hole and the windings are arranged around the magnetic core such that the magnetic core and the plurality of electrically conductive windings are interposed between the base structure and the other base structure.

19. The component carrier according to claim 18, further comprising at least one of the following components embedded within the stack: a switch; a driver integrated circuit; a capacitor; a diode.

20. The component carrier according to claim 19, wherein the components are electrically connected to form a DC/DC converter.

\* \* \* \* \*